United States Patent
Minamio et al.

(10) Patent No.: US 7,939,901 B2
(45) Date of Patent: May 10, 2011

(54) OPTICAL DEVICE FOR REDUCING DISTURBANCE LIGHT AND MANUFACTURING METHOD THEREOF

(75) Inventors: Masanori Minamio, Osaka (JP); Hiroyuki Ishida, Osaka (JP); Noriyuki Yoshikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 232 days.

(21) Appl. No.: 12/203,429

(22) Filed: Sep. 3, 2008

(65) Prior Publication Data

US 2009/0097139 A1    Apr. 16, 2009

(30) Foreign Application Priority Data

Oct. 15, 2007    (JP) .................................. 2007-268122

(51) Int. Cl.
   *H01L 31/02*    (2006.01)
(52) U.S. Cl. ................... 257/433; 257/E31.111
(58) Field of Classification Search .................. 257/433, 257/434, 678, E31.111
   See application file for complete search history.

(56) References Cited

U.S. PATENT DOCUMENTS

| | | | |
|---|---|---|---|
| 4,894,707 A | 1/1990 | Yamawaki et al. | |
| 5,622,873 A | 4/1997 | Kim et al. | |
| 6,274,927 B1 | 8/2001 | Glenn | |
| 6,420,204 B2 | 7/2002 | Glenn | |
| 6,934,065 B2 * | 8/2005 | Kinsman | 359/245 |
| 7,026,710 B2 * | 4/2006 | Coyle et al. | 257/704 |
| 7,199,438 B2 | 4/2007 | Appelt et al. | |
| 7,230,309 B2 * | 6/2007 | Bauer et al. | 257/433 |
| 7,274,094 B2 * | 9/2007 | Boon et al. | 257/680 |
| 7,420,257 B2 * | 9/2008 | Shibayama | 257/460 |
| 7,728,399 B2 * | 6/2010 | Walberg et al. | 257/434 |
| 2005/0104149 A1 * | 5/2005 | Bauer et al. | 257/433 |
| 2006/0001116 A1 * | 1/2006 | Auburger et al. | 257/433 |
| 2006/0022212 A1 * | 2/2006 | Waitl et al. | 257/98 |
| 2006/0255419 A1 * | 11/2006 | Lai et al. | 257/433 |
| 2007/0176274 A1 | 8/2007 | Yoneda et al. | |

FOREIGN PATENT DOCUMENTS

| | | |
|---|---|---|
| JP | 4-142751 | 5/1992 |
| JP | 9-298249 | 11/1997 |
| JP | 2003-332542 | 11/2003 |
| JP | 2006-186288 | 7/2006 |
| JP | 2006-303481 | 11/2006 |

* cited by examiner

*Primary Examiner* — Nathan W Ha
(74) *Attorney, Agent, or Firm* — McDermott Will & Emery LLP

(57) ABSTRACT

An optical element mounted on a wiring board is sealed by a sealing resin except an optical function region. Wires connecting the wiring board with the optical element are also sealed by the sealing resin. The optical function region is exposed as a bottom surface of a recess whose side surface is formed by the sealing resin. A boundary portion between the side surface of the recess and a top surface portion and a boundary portion between the side surface and bottom surface of the recess have a rounded shape.

5 Claims, 8 Drawing Sheets

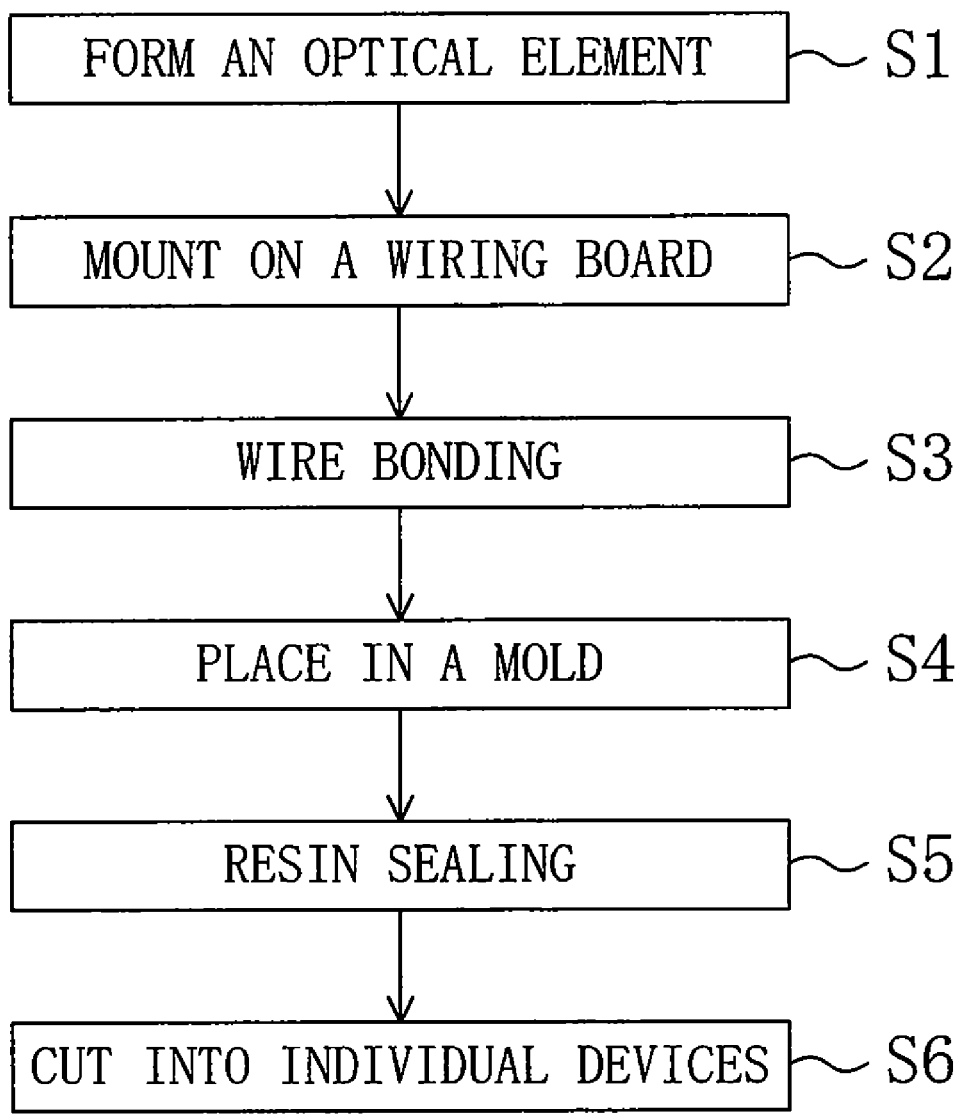

US 7,939,901 B2

OPTICAL DEVICE FOR REDUCING DISTURBANCE LIGHT AND MANUFACTURING METHOD THEREOF

BACKGROUND OF THE INVENTION

1. Field of the Invention

The invention relates to an optical device and a manufacturing method thereof. More particularly, the invention relates to an optical device including an optical element and a wiring board having the optical element mounted thereon, in which an electrically connected portion of the optical element and the wiring board is resin-sealed, and a manufacturing method of the optical device.

2. Related Art

Optical devices having an optical semiconductor device, such as a solid state imaging element and an LED (Light Emitting Diode), mounted on a wiring board have been known in the art. An example of such an optical device has a hollow package structure in which a light-transmitting substrate is provided over an optical function surface in order to protect the optical function surface (for example, see Japanese Laid-Open Patent Publication Nos. 2003-332542 and 2006-303481). In another example of such an optical device, a transparent resin is applied to an optical function surface (for example, see Japanese Laid-Open Patent Publication No. 9-298249).

However, such optical devices cannot be used to receive or emit blue-violet laser light having a wavelength as short as 405 nanometers (nm) because transparent resin discolors with time and the transmittance changes. Such a change in transmittance does not occur when a glass plate with a special coating is used as a light-transmitting substrate. However, such a glass plate is very expensive, and the manufacturing cost is increased.

In view of the above problems, Japanese Laid-Open Patent Publication No. 2006-186288 proposes an optical function element module. In this optical function element module, a bank for damming up a liquid sealing resin is provided around an optical function element on a substrate on which the optical function element is mounted. The liquid sealing resin is dropped between the optical function element and the bank to fill the space between the optical function element and the bank with the liquid sealing resin. A package component member has a light-transmission hole corresponding to an optical function portion of the optical function element. The package component member is made in contact with the sealing resin by placing the package component member on the bank so that the light-transmission hole faces the optical function portion of the optical function element. The sealing resin is then cured to fix the package component member on the substrate, and the bank is cut off and removed at the end.

In manufacturing of the optical function element module described in Japanese Laid-Open Patent Publication No. 2006-186288, it is difficult to control dropping of the liquid sealing resin so as to form a desired amount of sealing resin with a desired shape only within a desired range. Moreover, the liquid sealing resin may be dropped onto the optical function portion when the liquid sealing resin is dropped between the optical function element and the bank. The liquid sealing resin may also flow onto the optical function portion when the package component member is placed on the bank. This results in reduction in yield. In order to reliably avoid such problems, the area of the optical function element needs to be increased to assure a sufficient distance between the end of the optical function element corresponding to the bank and the optical function portion. However, this makes it impossible to achieve size reduction which is one of the objects of Japanese Laid-Open Publication No. 2006-186288.

The invention is made in view of the above problems and it is an object of the invention to provide a small optical device having an exposed optical function region, which can be manufactured by a simple, low-cost method.

SUMMARY OF THE INVENTION

In order to solve the above problems, an optical device according to the invention includes an optical element, a wiring board, and a sealing resin, and an optical function region is exposed by a recess having a predetermined shape.

More specifically, an optical device according to the invention includes: an optical element having an optical function region on one surface; a wiring board having the optical element mounted thereon and electrically connected to the optical element; a sealing resin for sealing at least an electrically connected portion of the optical element and the wiring board; and a recess in which at least the optical function region serves as a bottom surface and a side surface is formed by the sealing resin. A boundary portion between the side surface and a top surface portion surrounding the recess has a convex, rounded shape. A boundary portion between the side surface and the bottom surface has a concave, rounded shape. The "optical function region" herein indicates a region where light is converted to an electric signal or a region where a current is converted to light.

With the above structure, diffuse reflection of light can be prevented from occurring at the boundary between the side surface of the recess and the top surface portion and the boundary between the side surface and bottom surface of the recess.

The recess may have a tapered shape having a larger opening area at a top.

A recessed portion may be provided in a center of the one surface of the optical element and a recessed-portion peripheral surface portion may be provided around the recessed portion. The optical function region may be provided at a bottom of the recessed portion, and a boundary portion between the side surface and the bottom surface of the recess may be present on the recessed-portion peripheral surface portion. In this case, a sidewall of the recessed portion is not included in the side surface of the recess.

A protruding portion may be provided in a center of the one surface of the optical element and a protruding-portion peripheral surface portion may be provided around the protruding portion. The optical function region may be provided at a top surface of the protruding portion, and a boundary portion between the side surface and the bottom surface of the recess may be present on the protruding-portion peripheral surface portion.

The side surface of the recess may be a concave surface.

According to the invention, a method for manufacturing an optical device including an optical element having an optical function region on one surface, and a wiring board having the optical element mounted thereon and electrically connected to the optical element includes the steps of: mounting another surface of the optical element on the wiring board; electrically connecting the optical element with the wiring board; and resin-sealing at least an electrically connected portion of the optical element and the wiring board by using a mold. The mold includes a lower mold that is placed on an opposite surface of an optical element mounting surface of the wiring board, and an upper mold for placing the wiring board having the optical element mounted thereon between the upper mold and the lower mold. In the resin-sealing step, a sheet is interposed between the upper mold and the wiring board. The upper mold has a projection that presses the sheet against the optical function region. With this structure, an optical device having an exposed optical function region as a bottom surface can be easily and reliably manufactured.

The projection may have a flat top-end-face portion and a side-surface portion, and the side-surface portion may have a convex surface.

BRIEF DESCRIPTION OF THE DRAWINGS

FIG. 3 is a flowchart of a manufacturing process of the optical device according to the first embodiment;

DETAILED DESCRIPTION OF THE PREFERRED EMBODIMENTS

Figure 1:
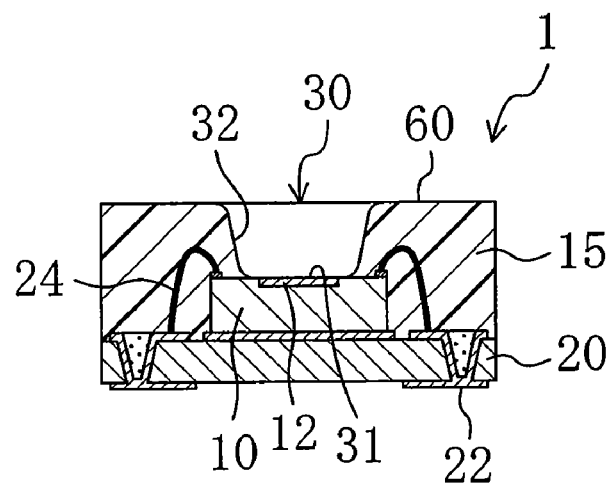
FIG. 1 is a cross-sectional view of an optical device according to a first embodiment of the invention.

Hereinafter, embodiments of the invention will be described in detail with reference to the accompanying drawings. For simplicity of description, elements having substantially the same function are denoted with the same reference numerals and characters throughout the figures.

First Embodiment

[Structure of an Optical Device]

Figure 2:
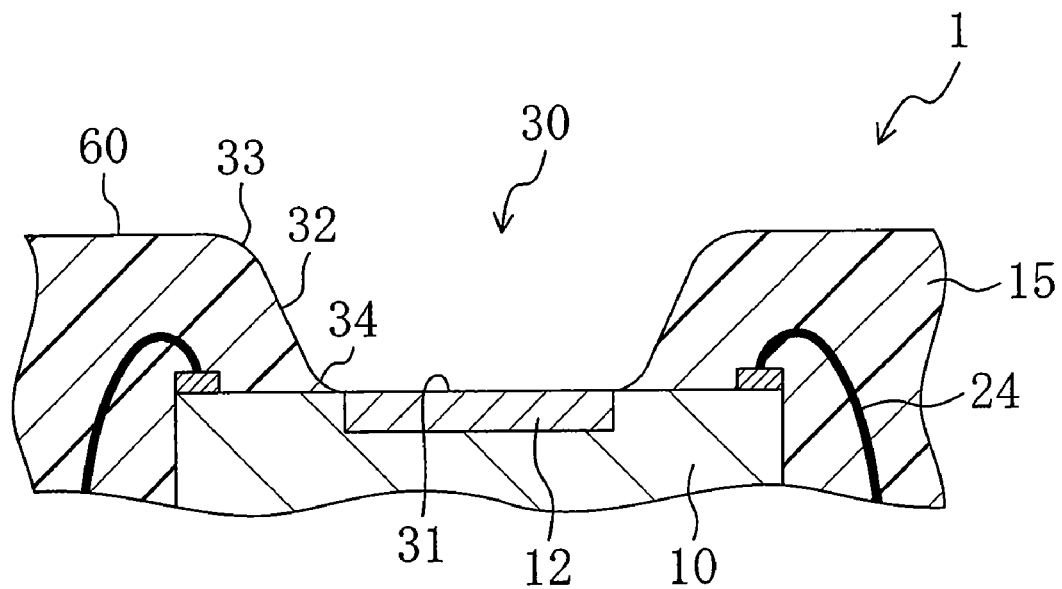
FIG. 2 is a partial enlarged cross-sectional view of the optical device according to the first embodiment.

FIG. 1 is a cross-sectional view of an optical device 1 according to a first embodiment of the invention. FIG. 2 is an enlarged cross-sectional view showing an upper part of the optical device 1. The optical device 1 is formed by resin-sealing an optical element (light-receiving element) 10 mounted on a wiring board 20 with a sealing resin 15 so as to expose an optical function region (light-receiving portion) 12.

The optical element 10 that is a semiconductor element has a rectangular flat plate shape. The optical function region 12 is formed in the center of one surface of the optical element 10. Electrode pads are provided on the periphery of this surface of the optical element 10. The optical element 10 is fixed to the wiring board 20 by mounting the other surface of the optical element 10 (the surface on which the optical function region 12 is not formed) on the wiring board 20. In other words, the optical element 10 is mounted on the wiring board 20 with the optical function region 12 facing upward. Note that, in the description given herein, the elements are arranged in the same up-down relation as that shown in the cross-sectional view. For example, the wiring board 20 and the optical element 10 are arranged such that the wiring board 20 is located under the optical element 10.

The wiring board 20 has a plurality of through holes around the optical element mounting region. Through electrodes are formed by plating the through holes and embedding a conductive member in the through holes. On the optical element mounting surface of the wiring board 20, the through electrodes are respectively electrically connected to connection wirings that are electrically connected by the electrode pads of the optical element 10 and wires 24. On the opposite surface of the optical element mounting surface of the wiring board 20, the through electrodes are respectively electrically connected to external connection electrodes 22 that are provided on that opposite surface. The external connection electrodes 22 are connected to external circuitry to receive power supply and to receive and output signals.

The sealing resin 15 seals the surface of the optical element 10 except the optical function region 12, the optical element mounting surface of the wiring board 20, and the wires 24 electrically connecting the optical element 10 with the wiring board 20. The optical function region 12 is exposed by a through hole provided in the sealing resin 15. In other words, the optical device 1 has a recess 30 whose bottom surface 31 is formed by the optical function region 12. A side surface 32 of the recess 30 is formed by the sealing resin 15. A top surface portion 60 of the optical device 1 is formed by the sealing resin 15 and extends approximately parallel to a light-receiving surface of the optical element 10 and extends around the recess 30. The recess 30 has a larger opening area at the top than at the bottom surface 31. The recess 30 thus has a tapered shape extending outward toward the top of the recess 30.

At the upper edge of the recess 30, a boundary portion 33 between the top surface portion 60 and the side surface 32 has a convex, rounded shape. A "rounded shape" is also referred to as an "R-shape (round shape)." A boundary portion 34 between the side surface 32 and the bottom surface 31 of the recess 30 has a concave, rounded shape. The surface of the sealing resin 15 including the recess 30 is a mirror-finished surface.

As described above, the optical device 1 of this embodiment has the recess 30 whose bottom surface 31 is formed by the optical function region 12, and the optical function region 12 is exposed. Therefore, the optical device 1 is preferable because it can directly receive short-wavelength light such as 405 nm and because the received light is neither attenuated nor reflected and light intensity does not change with time as opposed to an optical device having its upper part protected by a resin or a glass plate. Moreover, since the recess 30 is shaped as described above, disturbance light that is obliquely incident on the recess 30 is more likely to be reflected to the outside without entering the optical function region 12. If the boundary portion 33 between the top surface portion 60 and the side surface 32 and the boundary portion 34 between the side surface 32 and the bottom surface 31 is angular, light is diffusely reflected at these boundary portions and enters the optical function region 12 as disturbance light. However, since the boundary portions 33 and 34 have a rounded shape in this embodiment, such disturbance light is not produced.

[Manufacturing Method of the Optical Device]

A method for manufacturing the optical device 1 according to this embodiment will now be described with reference to the flowchart of FIG. 3 and the cross-sectional views of FIGS. 4A through 4D and FIGS. 5A and 5B.

First, an optical element 10 is formed on a semiconductor substrate (S1).

Figure 4A:
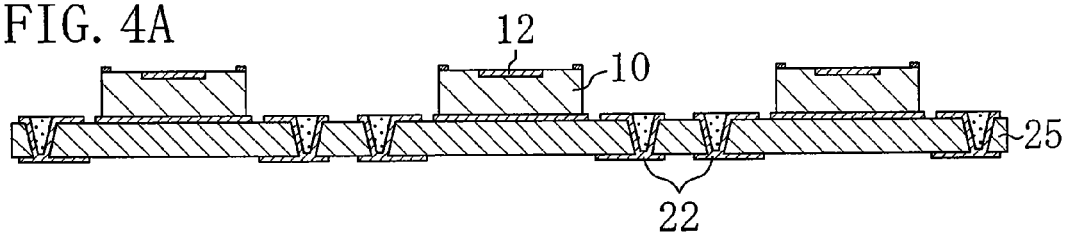
FIGS. 4A, 4B, 4C, and 4D are cross-sectional views illustrating the first half of the manufacturing process of the optical device according to the first embodiment.

As shown in FIG. 4A, the optical elements 10 are then mounted on a continuous wiring board 25 (S2). The continuous wiring board 25 is a connection of a plurality of individual wiring boards 20. The continuous wiring board 25 is cut into the individual wiring boards 20 in a later step.

Figure 4B:
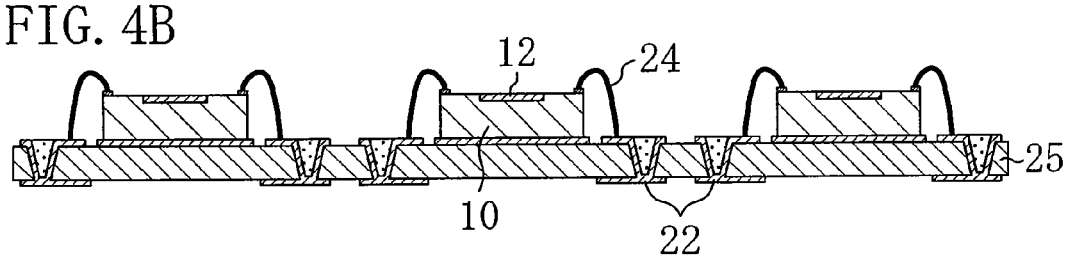

As shown in FIG. 4B, electrode pads of the optical elements 10 are then respectively electrically connected to connection wirings on the continuous wiring board 25 by wire bonding (S3).

Figure 4C:
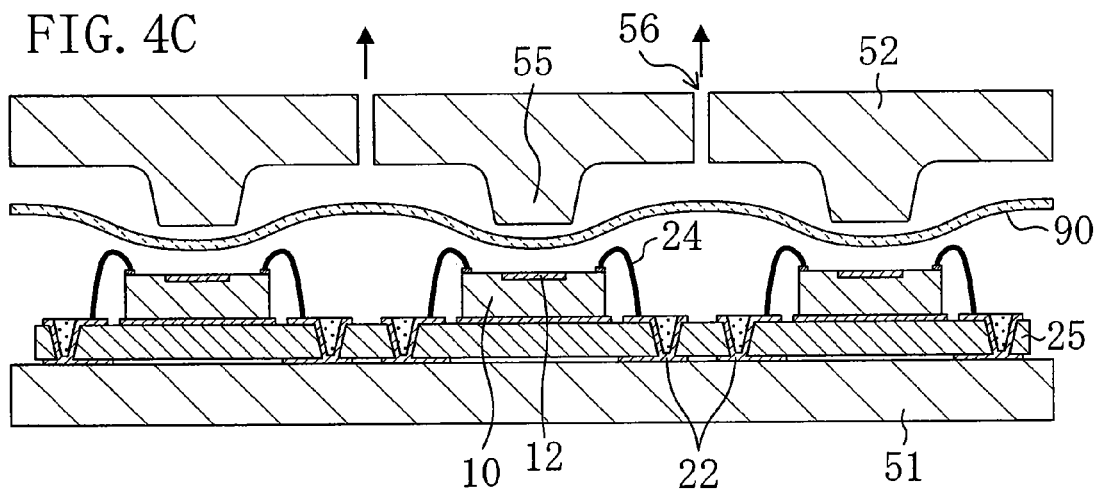

As shown in FIG. 4C, the continuous wiring board 25 having the optical elements 10 mounted thereon is then placed in a mold (S4). The mold is comprised of a lower mold 51 and an upper mold 52, and the continuous wiring board 25 is placed between the lower mold 51 and the upper mold 52. The surface of the continuous wiring board 25 on which no optical element is mounted is placed on a flat surface of the lower mold 51. The upper mold 52 has protrusions 55 protruding toward the respective optical elements 10. A plastic sheet 90 is placed between the upper mold 52 and the continuous wiring board 25. The sheet 90 is vacuum-suctioned through vacuum holes 56 so that the sheet 90 tightly adheres to a surface of the upper mold 52. Note that the sheet 90 is preferably made of plastic that is flexible and separable from the mold. One example of preferred materials is fluororesin.

The protrusions 55 are provided at such positions that the protrusions 55 are respectively in contact with the optical function regions 12 through the sheet 90 when a sealing resin is introduced into the mold. The top end face of each protrusion 55 has a similar shape to that of the top surface of the optical function region 12 and is larger than the top surface of the optical function region 12. The projections 55 are placed in the mold so that the whole top surface of each optical function region 12 reliably abuts on the top end face of a corresponding one of the protrusions 55 through the sheet 90. Note that the sheet 90 is somewhat flattened when the upper mold 52 is pressed against the sheet 90. However, the sheet 90 prevents the protrusions 55 from directly contacting the optical function regions 12. Therefore, the protrusions 55 do not damage the optical function regions 12.

The protrusions 55 have a tapered shape having a diameter reduced toward the top. This tapered shape prevents a part of the sealing resin 15 from adhering to the protrusions 55 and being removed when the mold is removed after resin sealing.

Figure 4D:
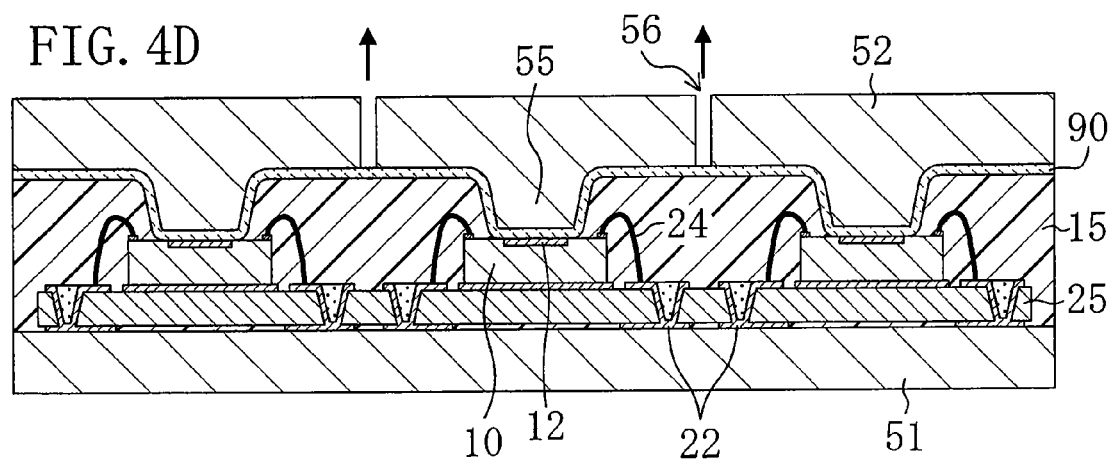

As shown in FIG. 4D, resin sealing is performed by introducing a resin into the mold (S5). By resin sealing, the surfaces of the optical elements 10 other than the optical function regions 12, the wires 24, and the optical element mounting surface of the continuous wiring board 25 are sealed by the sealing resin 15. At this time, the sheet 90 is slightly deformed into a rounded shape at the edge of the top end face of each protrusion 55 and at the bottom of each protrusion 55 due to the shape of the protrusions 55, the suction power, and the pressure of the sealing resin.

Figure 5A:
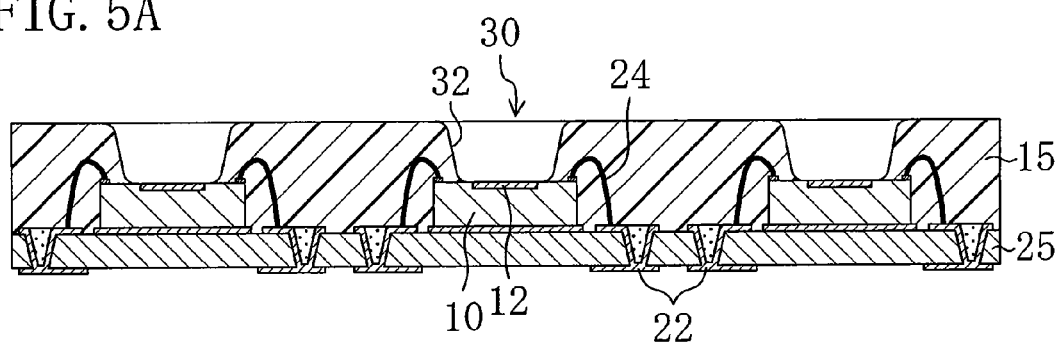
FIGS. 5A and 5B are cross-sectional views illustrating the last half of the manufacturing process of the optical device according to the first embodiment.

After the resin is solidified, the mold is removed, whereby the resin-sealed continuous wiring board 25 is obtained as shown in FIG. 5A.

Figure 5B:
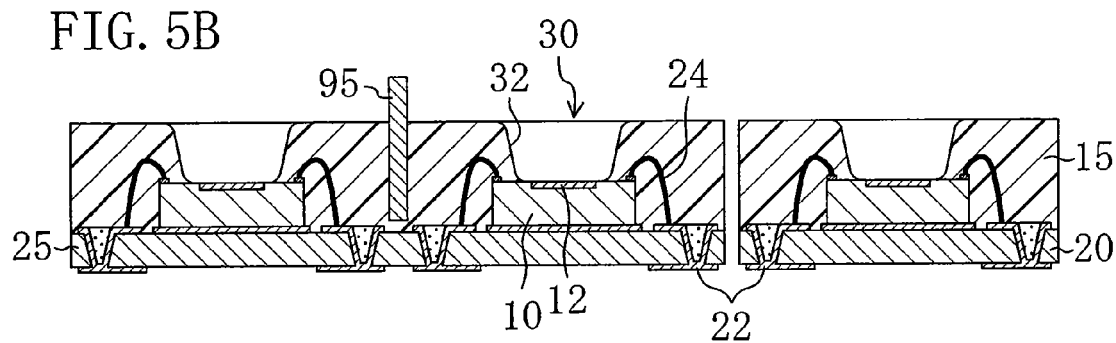

The continuous wiring board 25 is then cut into individual devices by a blade 95 as shown in FIG. 5B (S6). The optical device 1 is thus completed.

In this embodiment, the projections 55 of the upper mold 52 respectively abut on the optical function regions 12 through the sheet 90. Therefore, the optical device 1 having the exposed optical function region 12 can be easily fabricated. Each protrusion 55 has a tapered shape having a diameter reduced toward the top, and the top end face of each protrusion 55 has substantially the same area as that of the optical function region 12. Therefore, the above-described shape of the recess 30 can be easily formed. Manufacturing and device characteristics are not affected by reducing the distance between the optical function region 12 and the electrode pads. Therefore, a small optical device 1 can be implemented.

The top end face of each protrusion 55 of the upper mold 52 has a similar shape to that of the optical function region 12, and has substantially the same area as that of the optical function region 12. Since each protrusion 90 abuts on the respective optical function region 12 through the sheet 90, the abutting area of each protrusion 90 including the sheet 90 on the respective optical function region 12 is larger than the area of the optical function region 12. Accordingly, even when there are a variation in size and position accuracy of the optical element 10 and the continuous wiring board 25 and a variation in mounting position of the optical element 10, the whole surface of each optical function region 12 will reliably abut within the range of the top end face of the respective projection 55 including the sheet 90 as long as these variations are within an allowable range as a product. Accordingly, it is assured that the sealing resin 15 that disturbs traveling of light is not present on the surface of the optical function region 12 and in the space located vertically above the optical function region 12.

In this embodiment, the optical device 1 having the exposed optical function region 12 is easily formed with high accuracy. In the semiconductor devices described in Japanese Laid-Open Patent Publication Nos. 9-298249 and 2003-332542, the optical function surface is exposed during the manufacturing process, as in the case of the optical device of this embodiment. In the semiconductor device described in Japanese Laid-Open Patent Publication Nos. 9-298249, however, a memory cell portion is exposed by making a window portion by melting a sealing resin with sulfuric acid or the like. Therefore, as the size of the semiconductor device is reduced, an electrode pad portion of a semiconductor element and Cu (copper) wirings are more likely to be corroded. It is therefore very difficult to apply this structure to an optical device for which size reduction has been demanded. Moreover, in the semiconductor device described in Japanese Laid-Open Patent Publication No. 2003-332542, resin sealing is performed with a mold after a silicone resin protective film is applied to a light-receiving surface. The protective film is peeled after resin sealing. Therefore, it is very difficult and time-consuming to apply the protective film to an accurate position and to peel the protective film at a time after resin sealing. Moreover, since a flat surface of an upper mold faces a solid imaging element, such a recess as in the optical device 1 of this embodiment is not formed.

In the optical function module described in Japanese Laid-Open Patent Publication No. 2006-186288, it is very difficult to control the shape of a hole-side end face of a sealing resin that is present around a hole formed in a package component. Therefore, light may enter an optical function portion due to diffuse reflection or the like at the hole-side end face of the sealing resin or at the lower edge of the hole in the package component. However, the optical device 1 of this embodiment does not have such a problem.

Second Embodiment

Figure 6A:
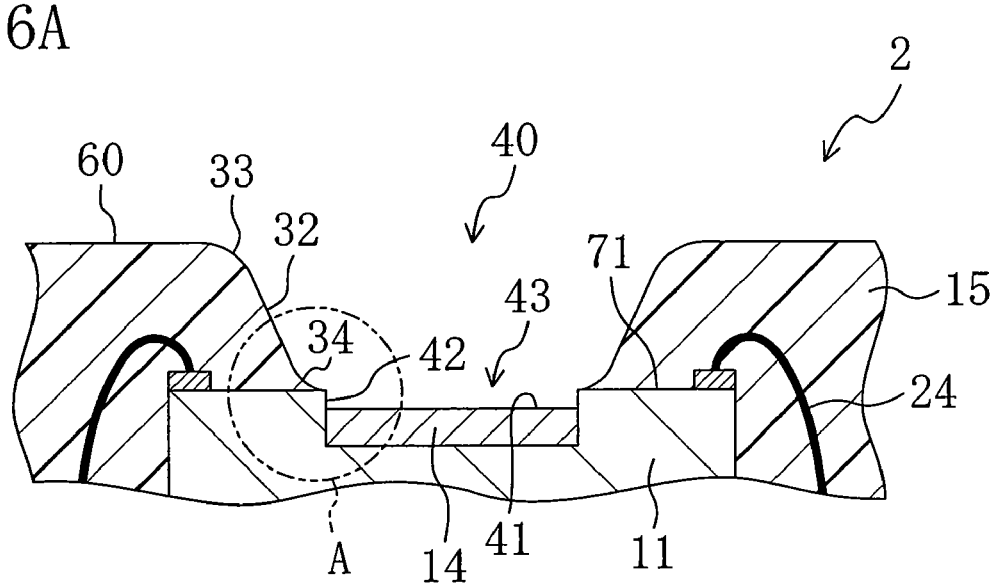
FIG. 6A is a partial enlarged cross-sectional view of an optical device according to a second embodiment of the invention.
Figure 6B:
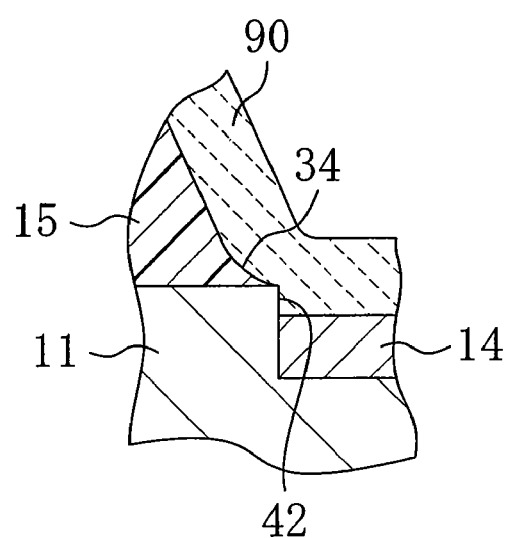
FIG. 6B is an enlarged view of a portion A in FIG. 6A.

An optical device 2 of a second embodiment shown in FIGS. 6A and 6B is substantially the same as the optical device 1 of the first embodiment except the shape of an optical function region 14 of an optical element 11. Therefore, only the differences from the first embodiment will be described below and description of the same portions will be omitted.

In the optical device 2 of this embodiment, the optical function region 14 is formed at the bottom of a recessed portion 43 formed in the center of a light-receiving surface of the optical element 11. A region surrounding the recessed portion 43 on the light-receiving surface is a recessed-portion peripheral surface portion 71. As shown in FIG. 6B, when resin sealing is performed, the sheet 90 abuts on the whole optical function region 14 and a recessed-portion sidewall 42 due to the flexibility of the sheet 90. The sheet 90 (and the protrusion 55 behind the sheet 90) rises upward from the recessed-portion sidewall 42. Therefore, a boundary portion 34 between a side surface 32 of a recess 40 and a bottom surface 41 of the recess 40 is located above the recessed-portion peripheral surface portion 71 and has a concave, rounded shape.

In this embodiment, the top end face of the projection 55 of the upper mold 52 is substantially the same in shape and size as the optical function region 14, and resin sealing is performed with the top end face of the projection 55 overlapping substantially the whole surface of the optical function region 14. Therefore, the sheet 90 abuts on the recessed-portion sidewall 42, and the sealing resin 15 can be reliably prevented from being placed on the optical function region 14.

The optical device 2 of this embodiment and a manufacturing method thereof have the same effects as those of the first embodiment except the above described effect.

Third Embodiment

Figure 7A:
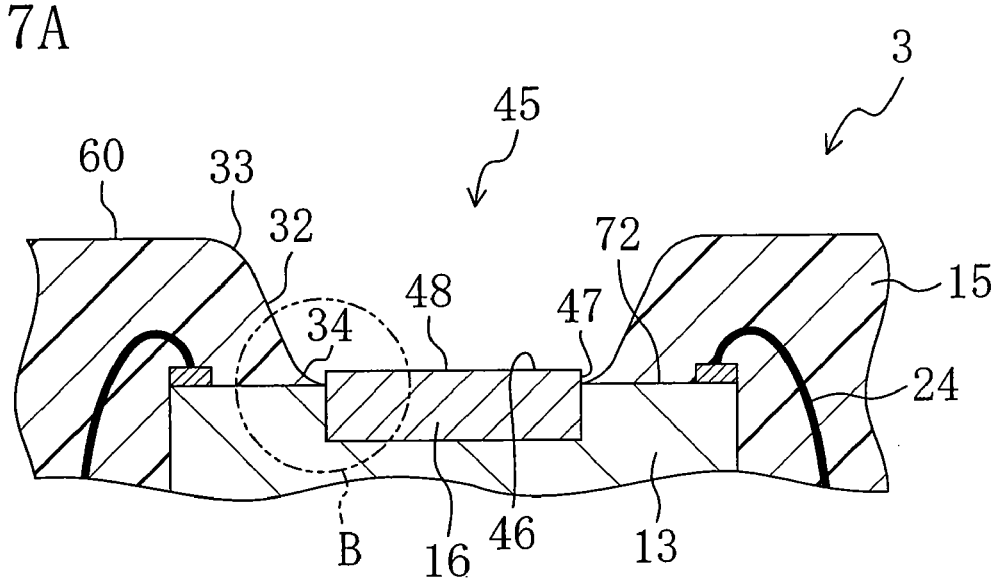
FIG. 7A is a partial enlarged cross-sectional view of an optical device according to a third embodiment of the invention.
Figure 7B:
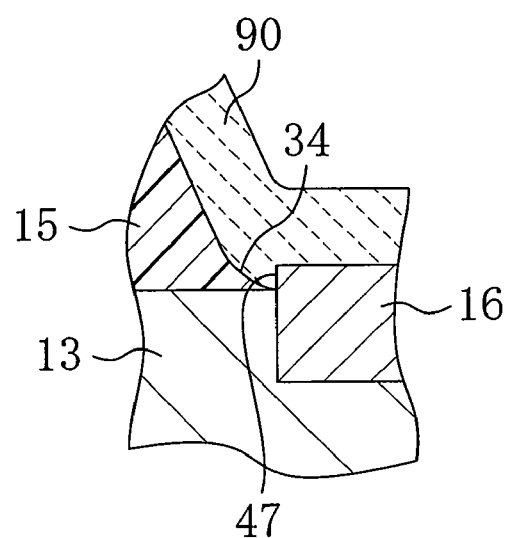
FIG. 7B is an enlarged view of a portion B in FIG. 7A.

An optical device 3 of a third embodiment shown in FIGS. 7A and 7B is substantially the same as the optical device 1 of the first embodiment except the shape of an optical function region 16 of an optical element 13. Therefore, only the differences from the first embodiment will be described below and description of the same portions will be omitted.

In the optical device 3 of this embodiment, the optical function region 16 is formed at the top surface of a protruding portion 48 provided in the center of a light-receiving surface of the optical element 13. A region surrounding the protruding portion 48 on the light-receiving surface is a protruding-portion peripheral surface portion 72. As shown in FIG. 7B, when resin sealing is performed, the sheet 90 abuts on the whole optical function region 16 and on a sidewall 47 of the protruding portion 48 due to the flexibility of the sheet 90. Therefore, a boundary portion 34 between a side surface 32 of a recess 45 and a bottom surface 46 of the recess 45 is located above the protruding-portion peripheral surface portion 72 and has a concave, rounded shape.

In this embodiment, the top end face of the projection 55 of the upper mold 52 is substantially the same in shape and size as the optical function region 16, and resin sealing is performed with the top end face of the projection 55 overlapping substantially the whole surface of the optical function region 16 and with the sheet 90 abutting also on the sidewall 47 of the protruding portion 48. The sealing resin 15 can thus be reliably prevented from being placed on the optical function region 16.

Note that the sidewall 47 of the protruding portion 48 is formed by forming a protruding portion with a thickness of 1 to 5 μm from a silicon (Si)-based compound such as SiO and $SiO_2$ and then covering the top surface of the Si-based compound with an AR coating (antireflection coating). The antireflection coating is selected as appropriate from $Si_3N_4$, $S_2O_2$, $Al_2O_3$, $ZnO_2$, $MgF_2$, ZnSe, and ZnS. Light scattering can thus be prevented.

The optical device 3 of this embodiment and a manufacturing method thereof have the same effects as those of the first embodiment except the above-described effect.

Fourth Embodiment

Figure 8A:
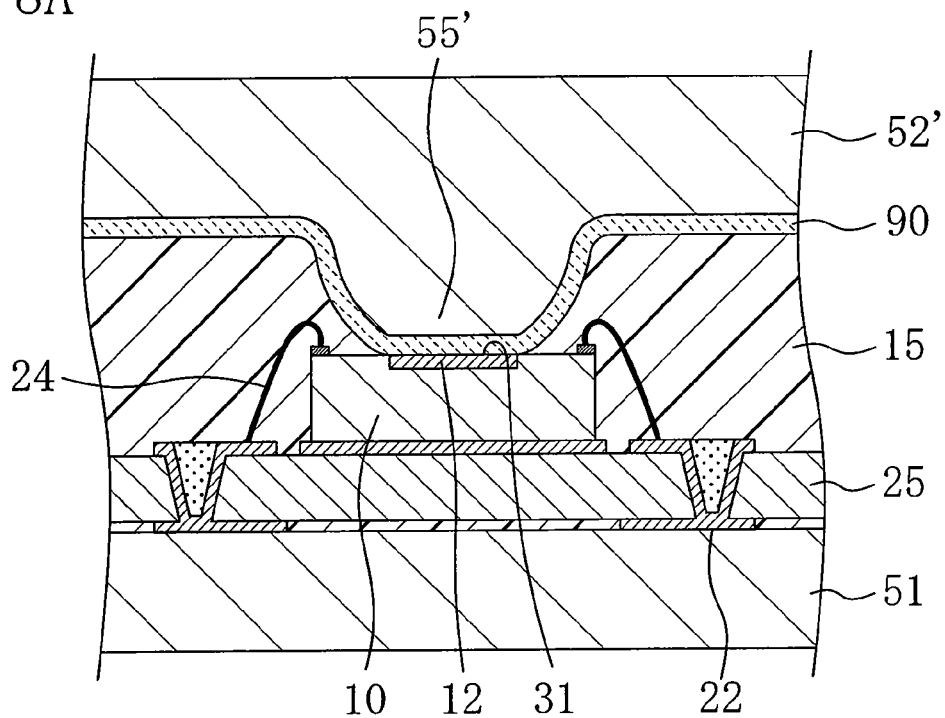
FIG. 8A is a cross-sectional view of an optical device according to a fourth embodiment of the invention during manufacturing process.
Figure 8B:
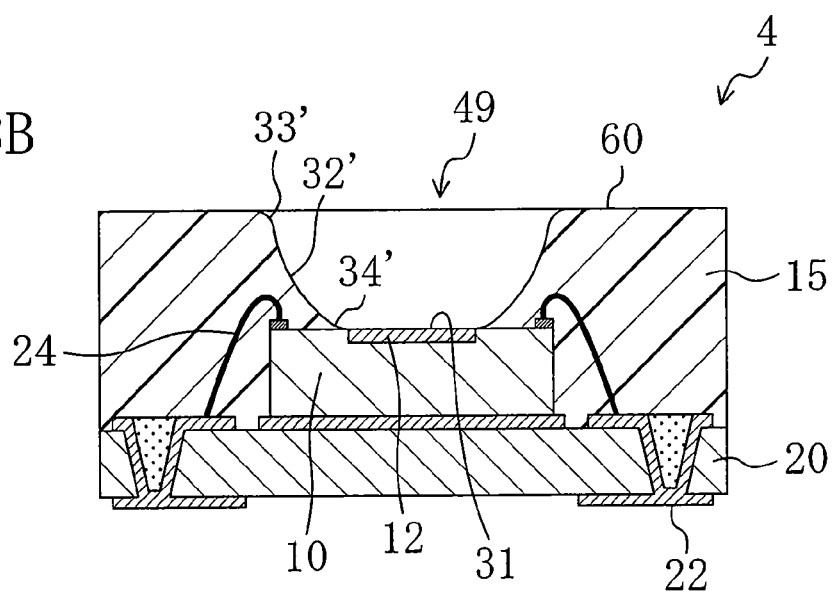
FIG. 8B is an enlarged view of the optical device.

An optical device 4 of a fourth embodiment shown in FIG. 8B is the same as the optical device 1 of the first embodiment except the shape of a recess 49. Therefore, only the differences from the first embodiment will be described below and description of the same portions will be omitted.

As shown in FIG. 8A, in the optical device 4 of this embodiment, a protrusion 55' of an upper mold 52' has a flat top-end-face portion and a convex side-surface portion. The shape of the projection 55' is different from that of the projection 55 of the first embodiment in that the projection 55' has a convex side-surface portion. By manufacturing the optical device 4 by using this upper mold 52', the recess 49 of the optical device 4 has a concave side surface 32'. Note that, in this embodiment as well, a boundary portion 33' between the top surface portion 60 and the side surface 32' and a boundary portion 34' between the side surface 32' and the bottom surface 31 have a rounded shape as in the first embodiment.

In this embodiment, the recess 49 has a concave side surface 32'. Therefore, external light that is incident on the side surface 32' is less likely to enter the optical function region 12, and light scattering is reduced. Moreover, the protrusion 55' is more likely to be separated from the sealing resin 15 than in the first embodiment, The optical device 4 of this embodiment and a manufacturing method thereof have the same effects as those of the first embodiment except the above-described effect.

Fifth Embodiment

Figure 9:
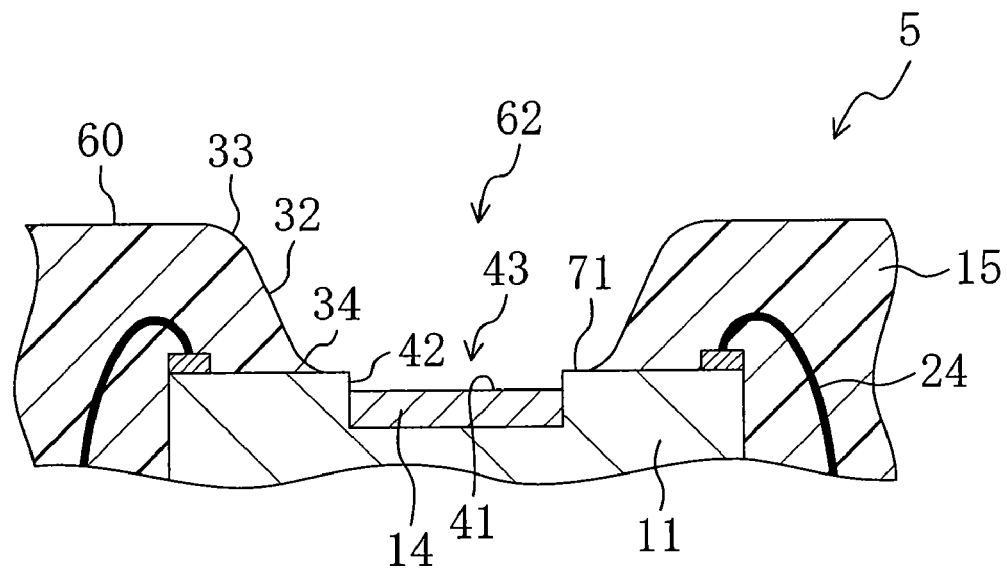
FIG. 9 is a partial enlarged cross-sectional view of an optical device according to a fifth embodiment of the invention.

An optical device 5 of a fifth embodiment shown in FIG. 9 is the same as the optical device 2 of the second embodiment except the form of a bottom surface of a recess 62. Therefore, only the differences from the second embodiment will be described below and description of the same portions will be omitted.

The optical device 5 of this embodiment is manufactured by using a mold whose upper mold 52 has a projection 55 having a larger top end face than the optical function region 14 (the shape of the top end face is similar to that of the optical function region 14). Therefore, a central portion that occupies most of the bottom surface of the recess 62 is the optical function region 14, but a peripheral portion of the bottom surface is a recessed-portion peripheral surface portion 71.

In this embodiment, positioning between the top end face of the protrusion 55 of the upper mold 52 and the optical function region 14 does not have to be performed so strictly as in the second embodiment. This increases productivity and is likely to reduce a defective product ratio, whereby the manufacturing cost can be reduced. Moreover, the sealing resin 15 can be more reliably prevented from being placed on the optical function region 14.

The optical device 5 of this embodiment and a manufacturing method thereof have the same effects as those of the second embodiment except the above-described effect.

Sixth Embodiment

Figure 10:
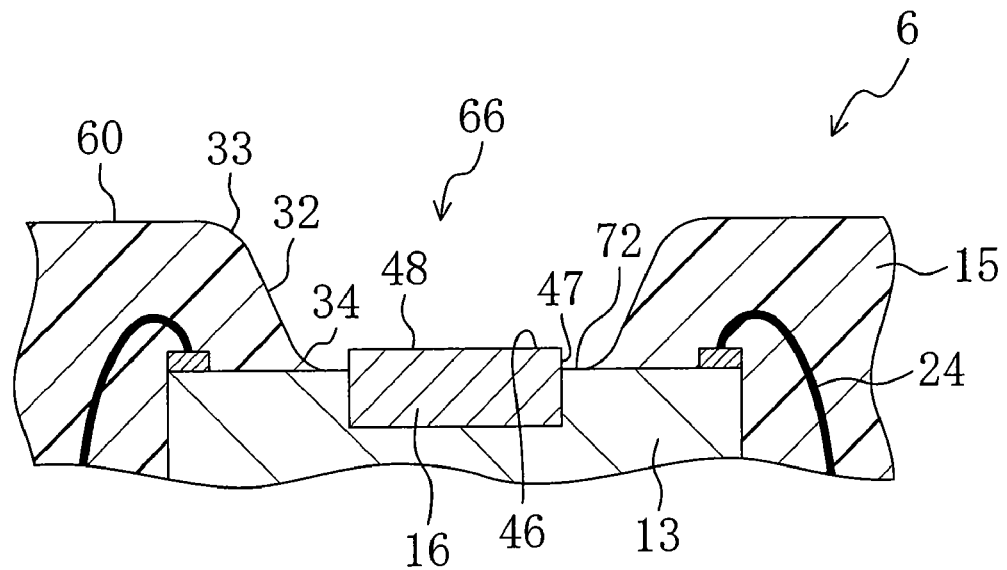
FIG. 10 is a partial enlarged cross-sectional view of an optical device according to a sixth embodiment of the invention.

An optical device 6 of a sixth embodiment shown in FIG. 10 is the same as the optical device 3 of the third embodiment except the form of a bottom surface of a recess 66. Therefore, only the differences from the third embodiment will be described below and description of the same portions will be omitted.

The optical device 6 of this embodiment is manufactured by using a mold whose upper mold 52 has a projection 55 having a larger top end face than the optical function region 16 (the shape of the top end face is similar to that of the optical function region 16). Therefore, a central portion that occupies most of the bottom surface of the recess 66 is the optical function region 16, but a peripheral portion of the bottom surface is a protruding-portion peripheral surface portion 72.

In this embodiment, positioning between the top end face of the protrusion 55 of the upper mold 52 and the optical function region 16 does not have to be performed so strictly as in the third embodiment. This increases productivity and is likely to reduce a defective product ratio, whereby the manufacturing cost can be reduced. Moreover, the sealing resin 15 can be more reliably prevented from being placed on the optical function region 16.

The optical device 6 of this embodiment and a manufacturing method thereof have the same effects as those of the third embodiment except the above-described effect.

Other Embodiments

The above embodiments are merely exemplary of the invention, and the invention is not limited to the above embodiments. For example, the protrusions of the upper mold of the mold do not necessarily have a tapered shape having a diameter reduced toward the top, but may have a fixed diameter.

The optical element may be made of Si or any material, such as a compound semiconductor like SiC (silicon carbide) and GaN (gallium nitride), as long as the material can provide an optical function. The optical function region may be a light-emitting region. An optical element may have an optical function region having a plurality of functions (such as a light receiving function and a light emitting function).

The wiring board may be made of any material such as resin (e.g., polyimide) and ceramic as long as the material can be used as a wiring board material.

In the first and fourth embodiments, in order to more reliably expose the optical function region, the top end face of each projection of the upper mold may be larger than the optical function region so that the bottom surface of the recess includes the surface of the optical element located outside the optical function region.

The mold of the fourth embodiment may be applied to the second, third, fifth, and sixth embodiments.

The boundary between the side surface of the recess in the sealing resin and the top surface portion of the sealing resin and the boundary between the side surface and bottom surface of the recess in the sealing resin have a rounded shape. Therefore, diffuse reflection of light is prevented from occurring in these boundary portions and unnecessary light can be prevented from entering the optical function region. Moreover, light emitted from the optical function region can be prevented from being diffusely reflected.

As has been described above, the optical device according to the invention is useful as, for example, a small optical device having an exposed optical function region and receiving and emitting short-wavelength light.

What is claimed is:

1. An optical device, comprising:
   an optical element having an optical function region on one surface;
   a wiring board having the optical element mounted thereon and electrically connected to the optical element;
   a sealing resin for sealing at least an electrically connected portion of the optical element and the wiring board; and
   a recess in which at least the optical function region serves as a bottom surface and a side surface is formed by the sealing resin, wherein
   a boundary portion between the side surface and a top surface portion surrounding the recess has a convex, rounded shape, and
   a boundary portion between the side surface and the bottom surface has a concave, rounded shape.

2. The optical device according to claim 1, wherein the side surface of the recess is a concave surface.

3. The optical device according to claim 1, wherein the recess has a tapered shape having a larger opening area at a top.

4. An optical device, comprising:
   an optical element having an optical function region on one surface;
   a wiring board having the optical element mounted thereon and electrically connected to the optical element;
   a sealing resin for sealing at least an electrically connected portion of the optical element and the wiring board; and
   a recess in which at least the optical function region serves as a bottom surface and a side surface is formed by the sealing resin, wherein
   a boundary portion between the side surface and a top surface portion surrounding the recess has a convex, rounded shape,
   a boundary portion between the side surface and the bottom surface has a concave, rounded shape, and
   a recessed portion is provided in a center of the one surface of the optical element and a recessed-portion peripheral surface portion is provided around the recessed portion, the optical function region is provided at a bottom of the recessed portion, and a boundary portion between the side surface and the bottom surface of the recess is present on the recessed-portion peripheral surface portion.

5. An optical device, comprising:
   an optical element having an optical function region on one surface;
   a wiring board having the optical element mounted thereon and electrically connected to the optical element;
   a sealing resin for sealing at least an electrically connected portion of the optical element and the wiring board; and
   a recess in which at least the optical function region serves as a bottom surface and a side surface is formed by the sealing resin, wherein
   a boundary portion between the side surface and a top surface portion surrounding the recess has a convex, rounded shape,
   a boundary portion between the side surface and the bottom surface has a concave, rounded shape, and a protruding portion is provided in a center of the one surface of the optical element and a protruding-portion peripheral surface portion is provided around the protruding portion, the optical function region is provided at a top surface of the protruding portion, and a boundary portion between the side surface and the bottom surface of the recess is present on the protruding-portion peripheral surface portion.

* * * * *